United States Patent
Klomsdorf et al.

(10) Patent No.: US 11,063,619 B1
(45) Date of Patent: Jul. 13, 2021

(54) COMMUNICATION DEVICE THAT TUNES AN ANTENNA BY PROXIMAL ASSOCIATION

(71) Applicant: MOTOROLA MOBILITY LLC, Chicago, IL (US)

(72) Inventors: Armin Klomsdorf, Chicago, IL (US); Farhad Farzami, Chicago, IL (US); John P. Vitale, Chicago, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 16/738,711

(22) Filed: Jan. 9, 2020

(51) Int. Cl.
  *H04B 1/04* (2006.01)
  *H03H 7/38* (2006.01)
  *H04B 1/18* (2006.01)

(52) U.S. Cl.
  CPC ............ *H04B 1/0458* (2013.01); *H03H 7/38* (2013.01); *H04B 1/18* (2013.01)

(58) Field of Classification Search
  CPC ...... H04B 1/0458; H04B 1/18; H04B 1/3838; H03H 7/38
  See application file for complete search history.

(56) References Cited

U.S. PATENT DOCUMENTS

| | | | |
|---|---|---|---|
| 8,204,446 B2 | 6/2012 | Scheer et al. | |
| 2007/0091006 A1* | 4/2007 | Thober | H01Q 7/005 343/745 |
| 2013/0052967 A1 | 2/2013 | Black et al. | |
| 2014/0203980 A1* | 7/2014 | Mahanfar | H01Q 1/243 343/745 |

* cited by examiner

*Primary Examiner* — Nguyen T Vo
(74) *Attorney, Agent, or Firm* — Isidore PLLC

(57) ABSTRACT

A communication device, method, and computer program product provide an antenna subsystem including a first antenna positioned proximate to a second antenna. A radio frequency (RF) frontend includes a transmitter, a receiver, and an antenna tuning module coupled to the antenna(s). A controller is communicatively coupled to the RF frontend and a memory containing a proximal antenna association tuning (PAAT) application. The controller executes the PAAT application to enable the communication device to: (i) transmit a reference signal by the transmitter using the first antenna of the more than one antenna; (ii) measure an impedance value of the first antenna based on the transmission of the reference signal; (iii) identify a second antenna of the more than one antenna that is proximate to the first antenna; and (iv) tune, via the antenna tuning module, the first and the second antenna based on the impedance value of the first antenna.

18 Claims, 7 Drawing Sheets

_US 11,063,619 B1_

COMMUNICATION DEVICE THAT TUNES AN ANTENNA BY PROXIMAL ASSOCIATION

TECHNICAL FIELD

The present disclosure relates generally to communication devices that have dedicated receive antennas, and in particular to communication devices that implement impedance tuning of receive antennas.

DESCRIPTION OF THE RELATED ART

Cellular network technology has developed in stages that are referred to as generations (G). Cellular communications have expanded into multiple communication bands and modulation schemes through the evolution of the telecommunications standard from first generation (1G), second generation (2G), third generation (3G), fourth generation (4G), and now fifth generation (5G). With the advent of 5G, the number of antennas in communication devices, such as a smartphone, is increasing. It is typical to have eight (8) sub 6 GHz antennas in a communication device that incorporates 5G new radio (NR) radio access technology (RAT). Not all of these antennas are used for transmitting data traffic. Several antennas are dedicated to receiving operations, such as for 2×2 or 4×4 multiple input multiple output (MIMO) operations. Typically, the physical dimension of the antenna is not ideal for a particular frequency band and requires antenna tuning for electrical length or impedance. Since the dedicated receive antennas are not used to transmit, opportunities are not presented for closed loop tuning (e.g., impedance matching, aperture tuning, etc.). Consequently, product performance for radiated total isotropic sensitivity (TIS) is several decibels below optimum antenna tuning for these dedicated receive antennas.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
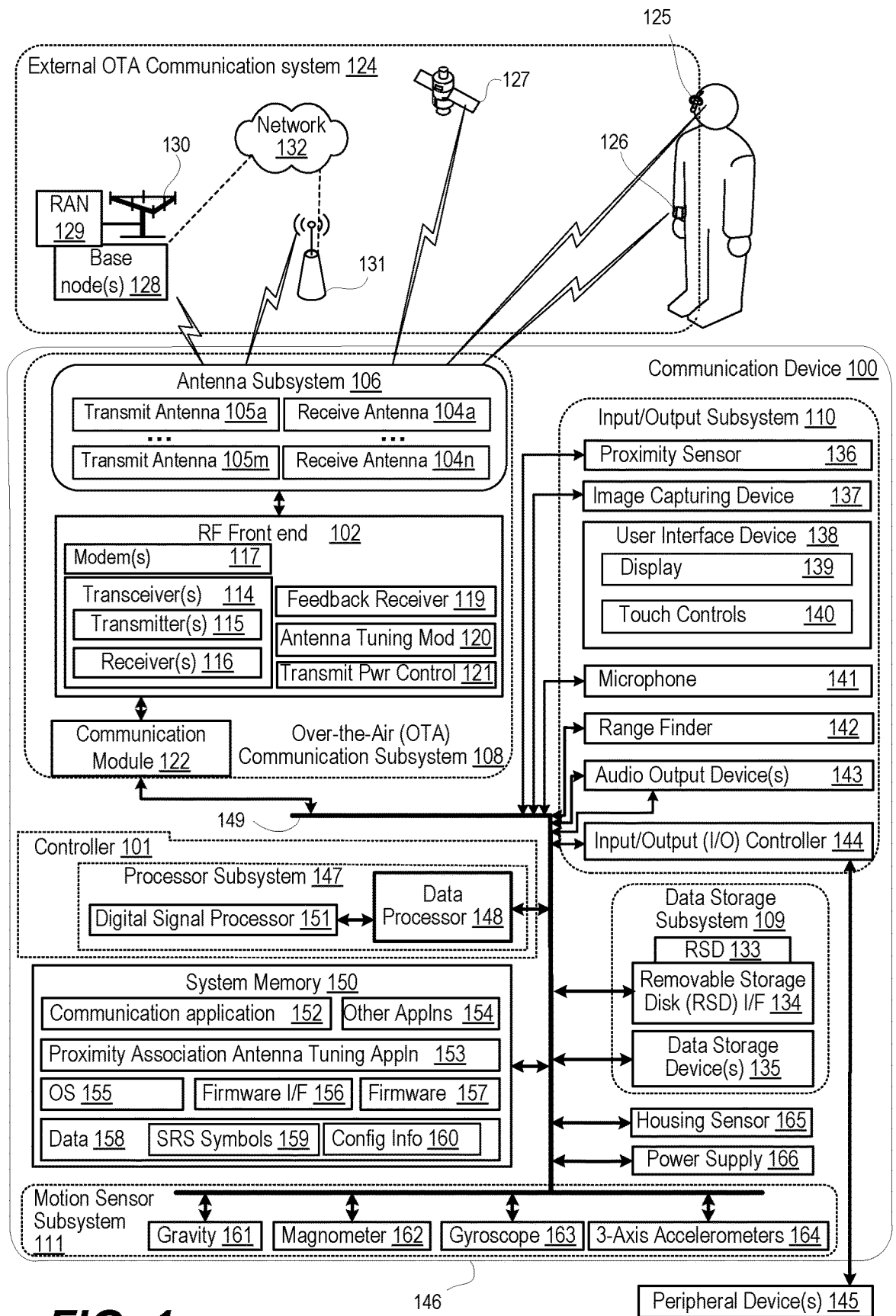
FIG. 1 is a functional block diagram of a communication device having a radio frequency (RF) front end that tunes receive antennas of an antenna subsystem, according to one or more embodiments.

According to aspects of the present disclosure, a communication device, method, and computer program product provide an antenna subsystem having more than one antenna that include a first antenna positioned proximate to a second antenna. The first antenna is used at least in part as a transmit antenna. The second antenna can be used entirely primarily as a receive antenna, which does not present an opportunity to measure antenna impedance during transmission for closed loop antenna tuning. A radio frequency (RF) frontend includes a transmitter, a receiver, and an antenna tuning module coupled to the antenna(s). A memory of the communication device contains a proximal antenna association tuning (PAAT) application. A controller is communicatively coupled to the RF frontend and the memory. The controller executes the PAAT application to enable the communication device to: (i) transmit a reference signal by the transmitter using the first antenna of the more than one antenna; (ii) measure an impedance value of the first antenna based on the transmission of the reference signal; (iii) identify the second antenna of the more than one antenna that is proximate to the first antenna; and (iv) tune, via the antenna tuning module, the first antenna and the second antenna based on the impedance value of the first antenna.

The present disclosure provides solutions that are superior to and overcomes the deficiencies found with existing solutions for tuning receive antennas, such as to use open loop or advanced open loop tuning. Open loop tuning uses a predetermined antenna match tune code for a given band. The tune code is fixed for that band and will not change as antenna loading/impedance changes. This results in non-optimal system efficiency for some antenna-user interaction cases. Advanced open loop tuning can be used to map various radio states to corresponding antenna tune codes that account, to a degree, for physical connections to the communication device, such as a headset jack or a charging cord. However, an advanced open loop tuning system is incapable of dynamically tuning for antenna impedance changes due to antenna-user interactions. The existing open loop tuning schemes will leave several dB of system efficiency unrealized. Realizing every dB possible in system efficiency is becoming ever more important as antenna volume and radiation efficiency are sacrificed to provide users with a large bezel-less display that leaves less room for antennas.

Capacitive sensing is a potential solution for detecting a user interaction with the communication device which may be detuning a transmitting or receiving antenna. However, capacitive sensing: (i) requires a significant cost of adding capacitive sensor system; (ii) increases hardware and software design complexity, and thus cost, because sensor outputs must be processed and linked into an antenna tuning system; and (iii) requires the capacitive sensor system to be calibrated. Aspects of the present innovation enable antenna tuning based on proximal association, avoiding the need for capacitive sensing and providing the antenna performance improvements of closed loop tuning.

In the following detailed description of exemplary embodiments of the disclosure, specific exemplary embodiments in which the various aspects of the disclosure may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof. Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment. It will be appreciated that for simplicity and clarity of illustration, elements illustrated in the figures have not necessarily been drawn to scale. For example, the dimensions of some of the elements are exaggerated relative to other elements.

It is understood that the use of specific component, device and/or parameter names, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

As further described below, implementation of the functional features of the disclosure described herein is provided within processing devices and/or structures and can involve use of a combination of hardware, firmware, as well as several software-level constructs (e.g., program code and/or program instructions and/or pseudo-code) that execute to provide a specific utility for the device or a specific functional logic. The presented figures illustrate both hardware components and software and/or logic components.

Those of ordinary skill in the art will appreciate that the hardware components and basic configurations depicted in the figures may vary. The illustrative components are not intended to be exhaustive, but rather are representative to highlight essential components that are utilized to implement aspects of the described embodiments. For example, other devices/components may be used in addition to or in place of the hardware and/or firmware depicted. The depicted example is not meant to imply architectural or other limitations with respect to the presently described embodiments and/or the general invention.

The description of the illustrative embodiments can be read in conjunction with the accompanying figures. Embodiments incorporating teachings of the present disclosure are shown and described with respect to the figures presented herein.

FIG. 1 is a functional block diagram of example communication device 100 in an operating environment within which the features of the present disclosure are advantageously implemented. In the illustrated embodiment, communication device 100 has controller 101 that triggers RF frontend 102 to perform closed-loop tuning of dedicated receive antennas 104a-104n and transmit antennas 105a-105m of antenna subsystem 106 for increased system efficiency. Communication device 100 can be one of a host of different types of devices, including but not limited to, a mobile cellular phone, satellite phone, or smart-phone, a laptop, a net-book, an ultra-book, a networked smart watch or networked sports/exercise watch, and/or a tablet computing device or similar device that can include wireless communication functionality. As a device supporting wireless communication, communication device 100 can be utilized as, and also be referred to as, a system, device, subscriber unit, subscriber station, mobile station (MS), mobile, mobile device, remote station, remote terminal, user terminal, terminal, user agent, user device, a Session Initiation Protocol (SIP) phone, a wireless local loop (WLL) station, a personal digital assistant (PDA), computer workstation, a handheld device having wireless connection capability, a computing device, or other processing devices connected to a wireless modem. These various devices all provide and/or include the necessary hardware and software to support the various wireless or wired communication functions as part of a communication system. Communication device 100 can be intended to be portable, hand-held, wearable, detachable, positioned in a fixed location, or mounted to a movable vehicle.

Referring now to the specific component makeup and the associated functionality of the presented components. In one or more embodiments, communication device 100 includes over-the-air (OTA) communication subsystem 108, data storage subsystem 109, input/output subsystem 110, and motion sensor subsystem 111 that are managed by controller 101. OTA communication subsystem 108 includes antenna subsystem 106 having receive antennas 104a-104n and transmit antennas 105a-105m. OTA communication subsystem 108 includes RF frontend 102 having transceiver(s) 114 that includes transmitter(s) 115 and receiver(s) 116. RF frontend 102 further includes modem(s) 117, feedback receiver 119, antenna tuning module 120, and transmit power control 121. OTA communication subsystem 108 includes communication module 122. OTA communication subsystem 108 communicates with external OTA communication system 124. External OTA communication system 124 can include devices such as wireless headset 125 and smart watch 126. External OTA communication system 124 can include global positioning system (GPS) satellites 127, base node(s) 128 of RANs 129 that transmit and receive via radio tower 130, access node 131, and networks 132.

Data storage subsystem 109 of communication device 100 includes removable storage device (RSD) 133, which is received in RSD interface 134. Controller 101 is communicatively connected, via system interlink 149 and RSD interface (I/F) 134, to RSD 133. Data storage subsystem 109 of communication device 100 includes data storage device(s) 135. Controller 101 is communicatively connected, via system interlink 149, to data storage device(s) 135. In one or more embodiments, removable storage device (RSD) 133 is a computer program product or computer readable storage device, which can be referred to as non-transitory. RSD 133 can be accessed by controller 101 to provision communication device 100 with program code. When executed by controller 101, the program code causes or configures communication device 100 to provide the functionality described herein.

I/O subsystem 110 includes proximity sensor 136 and image capturing device 137. I/O subsystem 110 also includes user interface device(s) 138 having display 139 and touch controls 140. I/O subsystem 110 also includes microphone 141, range finder 142, and audio output device 143. I/O subsystem 110 also includes I/O controller 144, which connects to peripheral devices 145 external to housing 146 of communication device 100. I/O controller 144 can provide drive signals and receive sensor readings in formats compatible with peripheral device 145. I/O controller 144 can act as a communication interface for peripheral device 145 and other parts of communication device 100.

Controller 101 controls the various functions and/or operations of electronic device 100. These functions and/or operations include, but are not limited to including, application data processing, communication with other electronic devices, navigation tasks, and signal processing. In one or more alternate embodiments, communication device 100 may use hardware component equivalents for application data processing and signal processing. For example, communication device 100 may use special purpose hardware, dedicated processors, general purpose computers, microprocessor-based computers, micro-controllers, optical computers, analog computers, dedicated processors and/or dedicated hard-wired logic.

Controller 101 includes processor subsystem 147, which includes one or more central processing units (CPUs), depicted as data processor 148, that are communicatively coupled, via system interlink 149, to system memory 150. Processor subsystem 147 can include one or more digital signal processors 151 that are integrated with data processor 148 or are communicatively coupled, via system interlink 149, to data processor 148. System memory 150 includes applications such as communication application 152, proximity association antenna tuning (PAAT) application 153 and other application(s) 154. System memory 150 further includes operating system (OS) 155, firmware interface (I/F) 156, such as basic input/output system (BIOS) or Uniform Extensible Firmware Interface (UEFI), and other firmware 157. System memory 150 includes data 158 such as sounding reference signal (SRS) symbols data 159 and antenna configuration information 160 used by PAAT application 153.

Processor subsystem 147 of controller 101 executes program code to provide operating functionality of communication device 100. These software and/or firmware modules have varying functionality when their corresponding program code is executed by processor subsystem 147 or secondary processing devices within communication device 100. Processor subsystem 147 of controller 101 can execute program code of PAAT application 153 to improve efficiency of dedicated receive antennas. The efficiency of an antenna is a ratio of the power delivered to the antenna relative to the power radiated from the antenna. A high efficiency antenna has most of the power present at the antenna's input radiated away.

In one or more embodiments, controller 101 of communication device 100 is communicatively coupled via system interlink 149 to OTA communication subsystem 108, data storage subsystem 109, input/output subsystem 110, and motion sensor subsystem 111. System interlink 149 represents internal components that facilitate internal communication by way of one or more shared or dedicated internal communication links, such as internal serial or parallel buses. As utilized herein, the term "communicatively coupled" means that information signals are transmissible through various interconnections, including wired and/or wireless links, between the components. The interconnections between the components can be direct interconnections that include conductive transmission media or may be indirect interconnections that include one or more intermediate electrical components. Although certain direct interconnections (interlink 149) are illustrated in FIG. 1, it is to be understood that more, fewer, or different interconnections may be present in other embodiments.

Communication module 122 of OTA communication subsystem 108 operates in baseband frequency range to encode data for transmission and decode received data, according to a communication protocol. Modem(s) 117 modulate baseband encoded data from communication module 122 onto a carrier signal to provide a transmit signal that is amplified by transmitter(s) 115. Modem(s) 117 demodulates the received signal from base node(s) 128 or the received signal from access node 131. The received signal is detected by antenna subsystem 106. The received signal is amplified and filtered by receiver(s) 116, which demodulate received encoded data from a received carrier signal. Antenna tuning module 120 adjusts the antenna impedance of antenna subsystem 106. Antenna tuning module 120 improves the antenna efficiency at desired transmit or receive frequencies of transmitter(s) 115 and receiver(s) 116, respectively, within transceiver(s) 114. Antenna tuning module 120 is electrically coupled to antenna subsystem 106 and compensates for any lossy dielectric effect of being proximate to a person. In one or more embodiments, antenna subsystem 106 includes transmit antennas $105a$-$105m$ and receive antennas $104a$-$104n$ that are individually tuned to selected RF bands to support different RF communication bands and protocols. In one or more embodiments, a plurality of antennas from among transmit antennas $105a$-$105m$ and receive antennas $104a$-$104n$ can be used in combination for multiple input, multiple output (MIMO) operation for beam steering and spatial diversity.

In one or more embodiments, controller 101, via OTA communication subsystem 108, performs multiple types of OTA communication with external OTA communication system 124. OTA communication subsystem 108 can communicate via Bluetooth connection with one or more personal access network (PAN) devices, such as wireless headset 125 and smart watch 126. Communication via Bluetooth connection includes both transmission and reception via a Bluetooth transceiver device. In one or more embodiments, OTA communication subsystem 108 communicates with one or more locally networked devices via a wireless local area network (WLAN) link provided by access node 131. Access node 131 is connected to wide area network 132, such as the Internet. In one or more embodiments, OTA communication subsystem 108 communicates with GPS satellites 127 to obtain geospatial location information. In one or more embodiments, OTA communication subsystem 108 communicates with RANs 129 having respective base stations (BSs) or base node(s) 128. RANs 129 are a part of a wireless wide area network (WWAN) that is connected to wide area network 132.

Data storage subsystem 109 provides nonvolatile storage that is accessible by controller 101. For example, data storage subsystem 109 can provide a large selection of other applications 154 that can be loaded into system memory 150. In one or more embodiments, local data storage device(s) 135 includes hard disk drives (HDDs), optical disk drives, solid state drives (SSDs), etc.

Axes-based motion sensor subsystem 111 includes one or more sensors that individually, or in combination, indicate orientation and motion of communication device 100. In one or more embodiments, gravity sensor 161 can be used to measure relative orientation with respect to the Earth's gravitational field. Magnetometer 162 is configured to measure strength and direction of a magnetic field in space that indicate direction relative to the magnetic geographic cardinal coordinates north, south, east, and west. Gyroscope 163 is configured to generate and provide sensor data that indicates orientation of communication device 100 along the three X-Y-Z axes based on rotation or angular momentum of communication device 100 around the multiple axes. Three-axis accelerometer 164 is configured to generate and provide sensor data that indicates acceleration that communication device 100 is experiencing relative to freefall. The acceleration indication can be used to determine orientation of electronic device 100 along the three axes, based on linear motion and gravity. Gravity sensor 161, magnetometer 162, gyroscope 163, and accelerometer 164 can be used alone or in combination to determine the relative orientation of communication device 100 in space. The relative orientation can include azimuth, pitch, and roll with respect to magnetic north and with respect to the horizontal and vertical axes relative to the direction of gravity.

Figure 4:
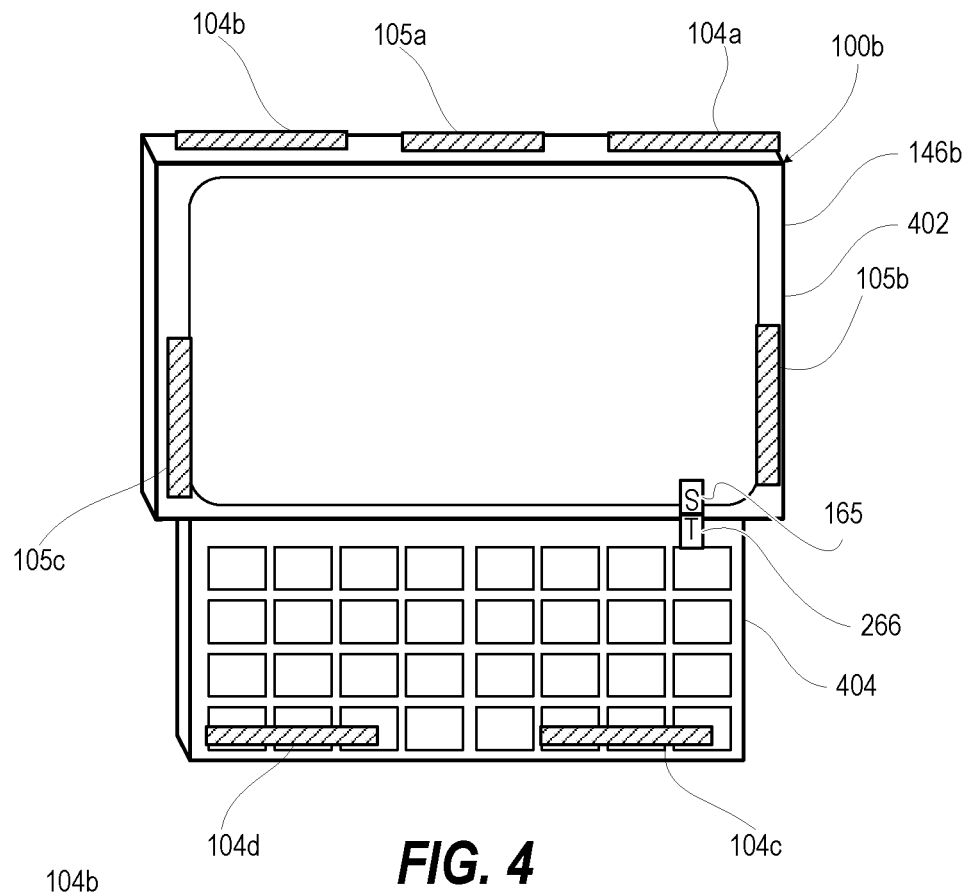
FIG. 4 is a front view of an example communication device in an open position, according to one or more embodiments.
Figure 5:
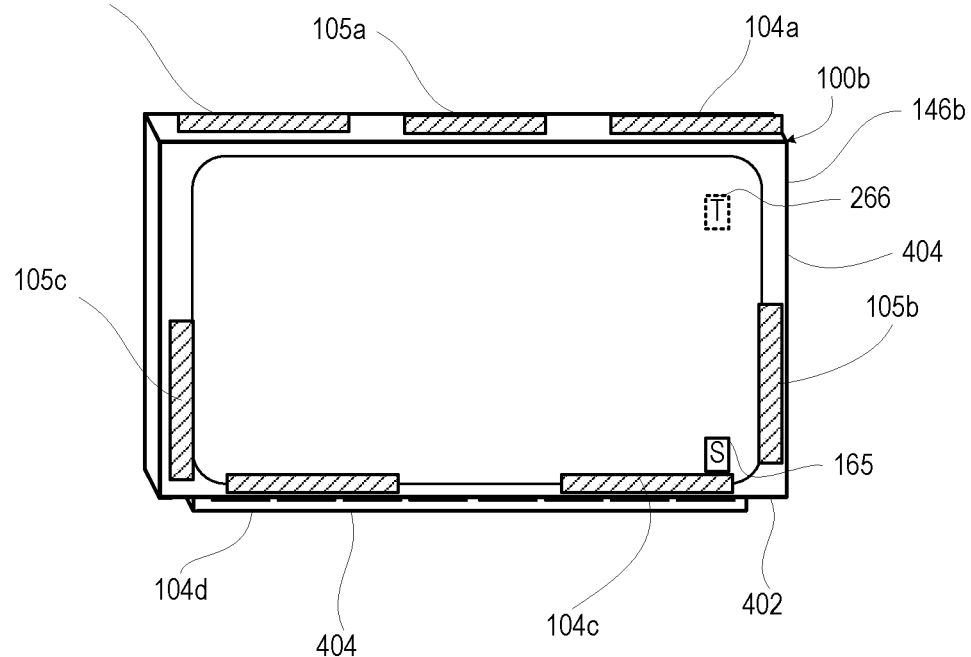
FIG. 5 is a front view of the example communication device of FIG. 4 in a closed position, according to one or more embodiments.

Housing sensor(s) 165 can detect relative positioning of sections of housing 146 that would affect determination of the relative orientation of communication device 100. For example, communication device can have a user interface that opens and closes by flipping a portion of housing 146a (FIGS. 2, 3) or opens or closes by sliding in a portion of housing 146b (FIGS. 4, 5).

Communication device 100 receives and distributes electrical power from power supply 166, such as a battery for mobile use or alternating current—direct current (AC-DC) converter for stationary use.

In one or more embodiments, controller 101 enables communication device 100 to perform closed loop impedance tuning of receive antennas 104a-104n using management capabilities of processor subsystem 147. In one or more embodiments, controller 101 is distributed to include management capabilities incorporated into OTA communication subsystem 108. A baseband controller, such as communication module 122, can have direct control of feedback receiver 119 and antenna tuning module 120. Data processor 148 of controller 101 can detect trigger events and prompt communication module 122 to perform uplink and downlink data communication transmission, SRS symbol transmission, measurement, and antenna tuning. In one or more embodiments, controller 101, for purposes of receive antenna tuning, can be autonomously executed within OTA communication subsystem 108. A receive antenna tuning mode can be triggered based on a recurring schedule, detection of a change of operating mode, or detection of user proximity to receive antennas 104a-104n. The receive antenna tuning mode can be prompted by a remote network entity such as base node 128.

The present disclosure recognizes an opportunity for improving tuning one of receive antennas 104a-104n that is proximate to one of transmit antennas 105a-105m. Communication devices 100 such as smartphones in modern, high speed, wireless communication systems such as 5G may include eight (8) to twelve (12) antennas covering the multitude of technologies and bands. The antennas are commonly distributed around the device perimeter. Antennas 104a-104n, 105a-105m may become detuned due to user interactions (UIs) when a user grips the communication device, holds the communication device up to his/her ear, or places the communication device against the body of the user. These situations are generally referred to herein as "user interactions" with the phone or UI for short. It is common for a smartphone to contain more receiving antennas than transmitting antennas, as higher order downlink (DL) carrier aggregation (CA) and DL 4×4 MIMO have become prevalent in flagship communication devices 100. 5G non-stand alone (NSA) mode of 5G NR is an option for 5G NR deployment. The 5G NSA mode depends on the control plane of an existing long term evolved (LTE) network for control planes. In 5G NSA mode, Evolved-universal terrestrial radio access (E-UTRA) provides control connectivity. 5G NR in 5G NSA mode is exclusively focused on the user plane. 5G NSA has over 3500 combinations of E-UTRA NR dual connectivity (EN-DC). The antenna subsystem has an increased number of receive antenna elements to interact with these different combinations. Many of these bands require mandatory DL 4×4 MIMO which exacerbates this situation of needing more receive antennas. With limited area in most communication devices for these antennas, the receive antennas are sized such that antenna tuning is required to correct an impedance difference with other components in the RF frontend 102 to avoid excessive signal reflections. The antenna reflections create antenna inefficiencies. With a large area of communication devices 100 dedicated to touchscreens, the receive antennas are also positioned on lateral edges that are subject to being close to a user, affecting the impedance of the receive antennas. Current chipsets offer the capability to apply advanced transmitter-based impedance sensing and tuning algorithms to transmitting antennas. Antennas which are receive only or are dedicated to transceiving Wi-Fi signals do not benefit from the advanced sensing and tuning algorithms. Therefore, a receive-only antenna or Wi-Fi antenna may become significantly detuned during user interactions (UIs) such as gripping or placing the phone in a user's pocket.

Figure 2:
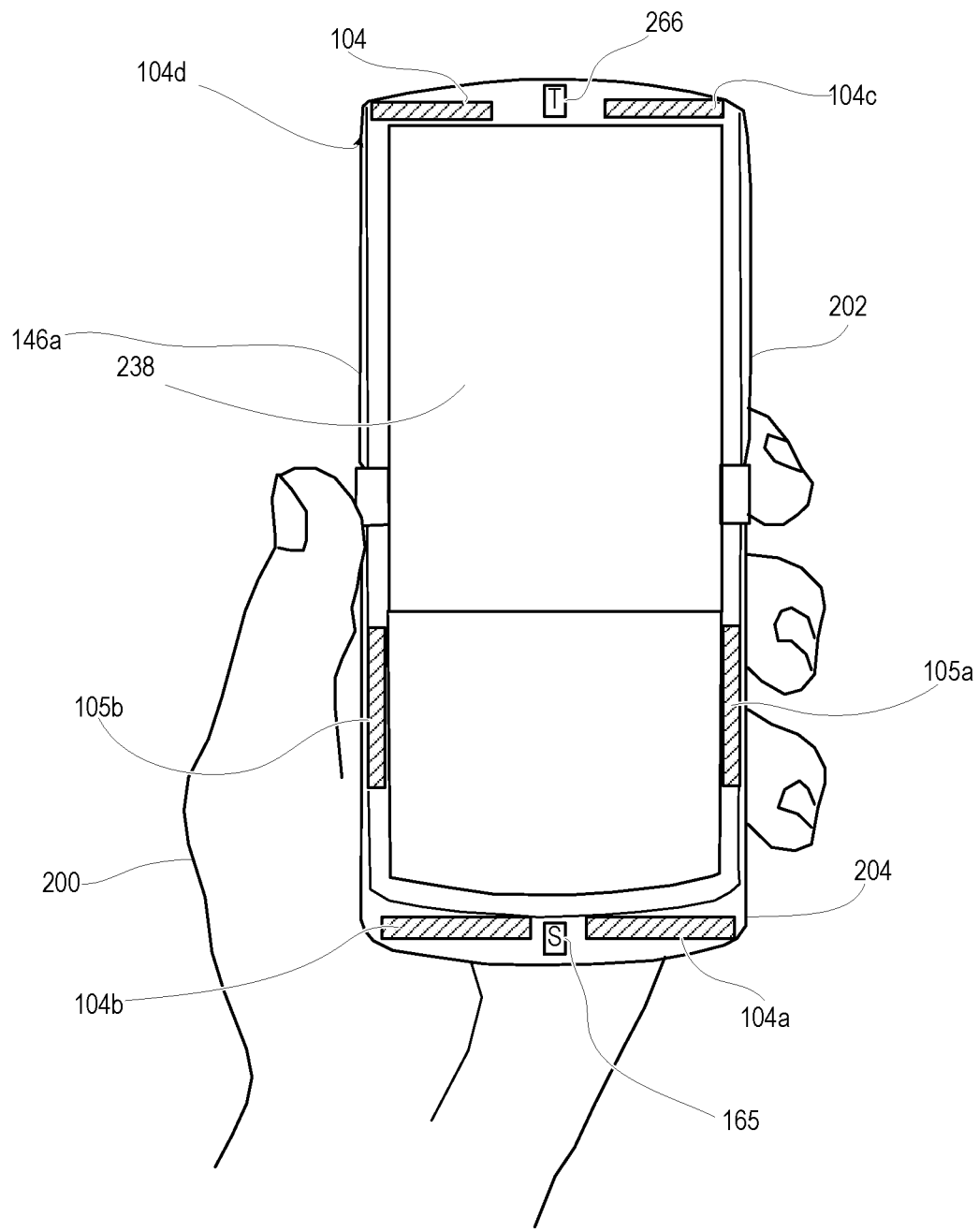
FIG. 2 is a front view of an example communication device in an open position and held in a hand of a user, according to one or more embodiments.

FIG. 2 depicts a front view of example communication device 100a in an open (unfolded) position and held in hand 200 of a user. Communication device 100a has top housing section 202 and bottom housing section 204 of housing 146a that are pivotally coupled together to fold and unfold relative to each other. Housing sensor 165 is attached to bottom housing section 204, and sensor target 266 is attached to top housing section 202. In the open (unfolded) position, housing sensor 165 does not detect sensor target 266. In one or more embodiments, housing sensor 165 is a Hall Effect sensor and sensor target 266 is a permanent magnet. In one or more embodiments, housing sensor 165 is an active electromagnetic sensor and sensor target 266 is a conductive metal. Housing sensor 165 is polled to detect a change in impedance (e.g., capacitance, inductance, resistance) in order to detect proximity to sensor target 266. In one or more embodiments, housing sensor 165 is a mechanical switch actuated by physical contact with sensor target 266.

A substantial portion of a front face of housing 146a is devoted to a user interface device, specifically touchscreen 238. Antennas 104a-104d, 105a-105b are attached to housing 146a on a lateral periphery around touchscreen 238. For clarity, five (5) antennas 104a-104d, 105a-105b are depicted. Aspects of the present disclosure can be applied to even fewer antennas or to more antennas. In addition, descriptions of antennas 104a-104d, 105a-105b are based herein on the depiction of communication device 100a. Communication device 100a can be oriented in any direction. Lower right and left receive antennas 104a-104b are attached to lower housing section 204 proximate respectively to lower right and left transmit antennas 105a-105b. With housing in the open (unfolded) position, impedance measuring of transmissions by lower right and left transmit antennas 105a-105b can detect an impedance change, indicative of UI and that warrants antenna tuning. Lower right and left receive antennas 104a-104b are proximally associated respectively with lower right and left transmit antennas 105*a*-105*b* and can be similarly tuned. Upper right and left receive antennas 104*c*-104*d* are attached to top housing section 202. In the open (unfolded) position, upper right and left receive antennas 104*c*-104*d* are not affected by UI. Without a transmit antenna in proximity to either of upper right and left receive antennas 104*a*-104*b* for an impedance measurement, upper right and left receive antennas 104*a*-104*b* can be tuned by open loop antenna tuning.

Figure 3:
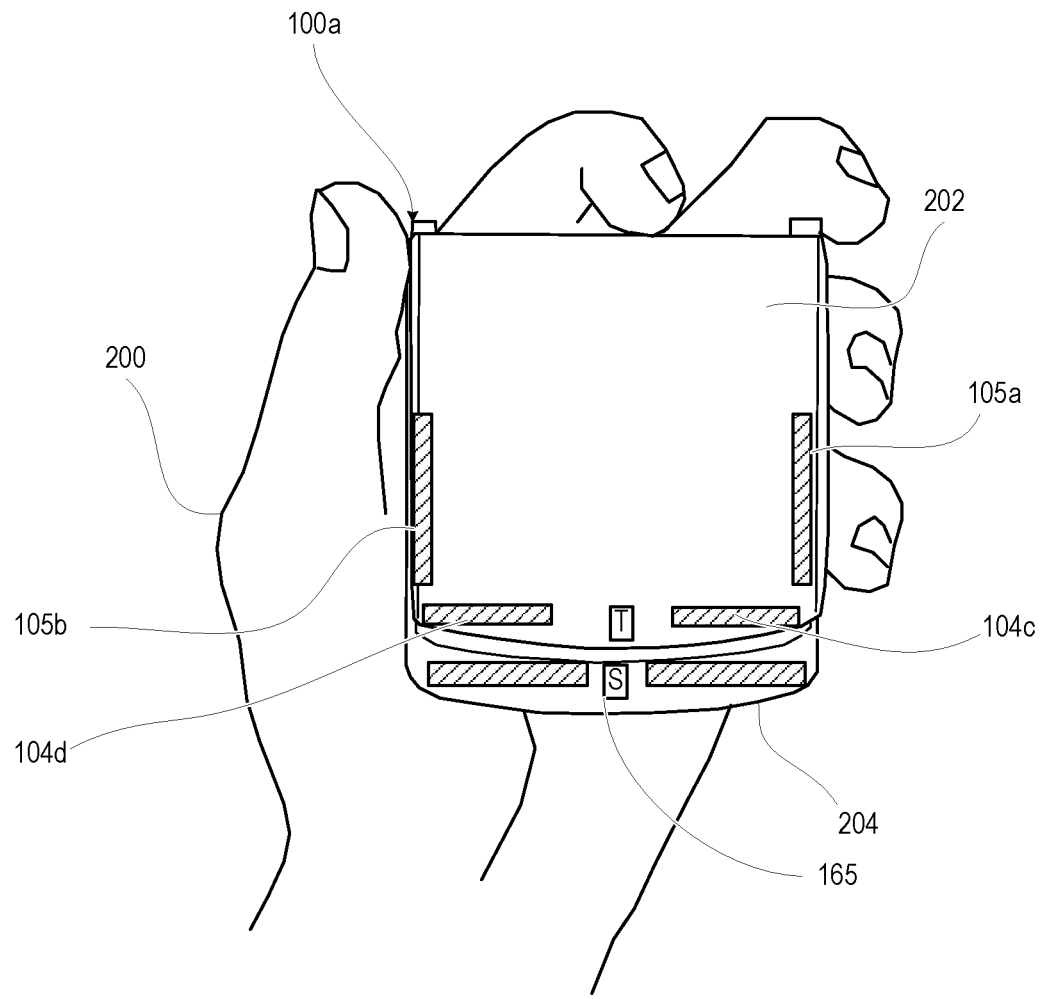
FIG. 3 is a front view of the example communication device of FIG. 2 in a closed position and held in the hand of the user, according to one or more embodiments.

FIG. 3 depicts a front view of example communication device 100*a* in a closed (folded) position and held in hand 200 of the user. Upper housing section 202 is folded down upon lower housing section 204, bringing upper right and left receive antennas 104*c*-104*d* down into proximity with lower right and left transmit antennas 105*a*-105*b*. Lower right and left transmit antennas 105*a*-105*b* are tuned to compensate for an impedance change caused by the UI. The same compensation can be used for upper right and left receive antennas 104*c*-104*d* to adjust for impedance effect of UIs without having to measure the impedance of upper right and left receive antennas 104*c*-104*d*. Based on position detection by sensor 165, controller 101 (FIG. 1) tunes upper right and left receive antennas 104*c*-104*d* by identifying proximity association with lower right and left transmit antennas 105*a*-105*b*.

FIG. 4 depicts a front view of example communication device 100*b* in an open (slid out) extended position. On a top edge, main housing section 402 of housing 146*b* includes center transmit antenna 105*a* flanked by right and left receive antennas 104*a*-104*b* that are always proximally associated with center transmit antenna 105*a*. UIs detected on center transmit antenna 105*a* are used to tune right and left receive antennas 104*a*-104*b*. Main housing section 402 includes right and left lateral transmit antenna 105*b*-105*c*. On a moving edge, keyboard housing section 404 of housing 146*b* includes right and left receive antennas 104*c*-104*d*. In the open position, right and left receive antennas 104*c*-104*d* are spaced apart from right and left lateral transmit antenna 105*b*-105*c*. In the open position, UIs detected on right and left lateral transmit antenna 105*b*-105*c* are not used to tune right and left receive antennas 104*c*-104*d*. In the open position, sensor 165 is proximate to sensor target 266, and a signal is transmitted to controller 101 (FIG. 1) informing controller 101 (FIG. 1) of the open position of the communication device 100*b*. Controller 101 (FIG. 1) is programmed to not perform closed loop tuning of right and left receive antennas 104*c*-104*d* when a proximal association is not identified with any transmit antennas that can be used for impedance measurement. In the open position, right and left lateral transmit antenna 105*b*-105*c* are not in the correct orientation relative to right and left receive antennas 104*c*-104*d* to allow for effective tuning of right and left receive antennas 104*c*-104*d*.

FIG. 5 depicts a front view of example communication device 100*b* in a closed (slid in) retracted position. Keyboard housing section 404 is slid into alignment with main housing section 402 of housing 146*b*. When/while communication device 100*b* is in the closed position, sensor 165 is not proximate to sensor target 266, and controller 101 (FIG. 1) no longer detects/receives the proximity signal from the sensor subsystem and thus determines that communication device 100*b* is in the closed position. Controller 101 (FIG. 1) is programmed such that, in such instances where communication device 100*b* is closed, controller 101 (FIG. 1) initiates tuning of right and left receive antennas 104*c*-104*d* by using the impedance measurement of adjacent right and left transmit antennas 105*b*-105*c*. Right and left receive antennas 104*c*-104*d* are brought into proximity respectively to right and left lateral transmit antenna 105*b*-105*c*. UIs detected on right and left lateral transmit antenna 105*b*-105*c* can be used to tune right and left lateral transmit antenna 105*b*-105*c* as well as the corresponding right and left receive antennas 104*c*-104*d*. In the closed position as well as in the open position, controller 101 (FIG. 1) tunes center transmit antenna 105*a* based on impedance measurements of transmissions by center transmit antenna 105*a*. Controller 101 (FIG. 1) uses the impedance measurement of the transmissions on center transmit antenna 105*a* to tune right and left receive antennas 104*a*-104*b*.

In one or more embodiments, impedance is measured for the transmit antennas 105*a*-105*m* (FIG. 1) by passing the transmit signal from a respective transmit antenna 105*a*-105*m* (FIG. 1) through a bi-directional coupler. Initially, the bi-directional coupler is switched to pass a portion of the transmission signal that is forward coupled to the feedback receiver that measures the magnitude and phase of the transmission signal. Then the bi-directional coupler is switched to pass a portion of the reflected signal that is reverse coupled to the feedback receiver. The feedback receiver measures the magnitude and phase of the reflected signal. The communication device has a data structure that contains tune codes. The tune codes are empirically determined based on prior open, short, and load (OSL) characterization of the RF frontend. The tune codes are indexed based on the measured amplitude and phase values to provide a correspondence impedance. Based on the impedance, the antenna tuning module tunes the respective transmit antenna.

Figure 6:
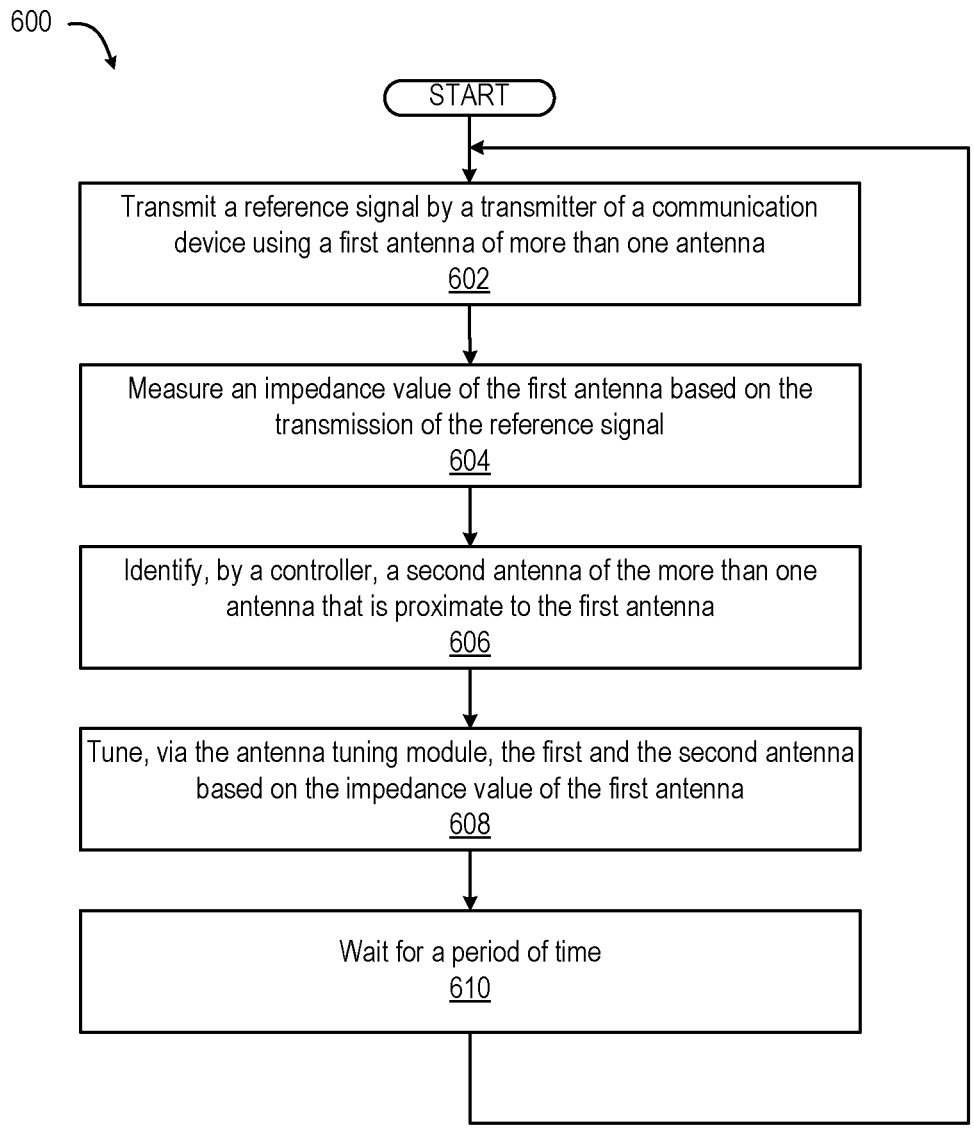
FIG. 6 depicts a flow diagram of a method for closed loop tuning of a receive antenna based on a proximity association with a transmit antenna, according to one or more embodiments.

FIG. 6 presents a flow diagram of a method for closed loop tuning of a receive antenna based on a proximity association with a transmit antenna. The description of method 600 is provided with general reference to the specific components illustrated within the preceding FIGS. 1-5. In at least one embodiment, method 600 can be implemented using controller 101 (FIG. 1) to enable RF frontend 102 (FIG. 1) to tune receive antennas 104*a*-104*n* (FIG. 1). Method 600 includes transmitting a reference signal by a transmitter of a communication device using a first antenna of more than one antenna (block 602). First antenna is used to transmit. Method 600 includes measuring an impedance value of the first antenna based on the transmission of the reference signal (block 604). Method 600 includes identifying, by a controller, a second antenna of the more than one antenna that is proximate to the first antenna (block 606). Second antenna is a receive antenna that is not used to transmit. Method 600 includes tuning, via the antenna tuning module, the first and the second antenna based on the impedance value of the first antenna (block 608). Method 600 includes waiting for a period of time (block 610). Then method 600 returns to block 602.

Figure 7A:
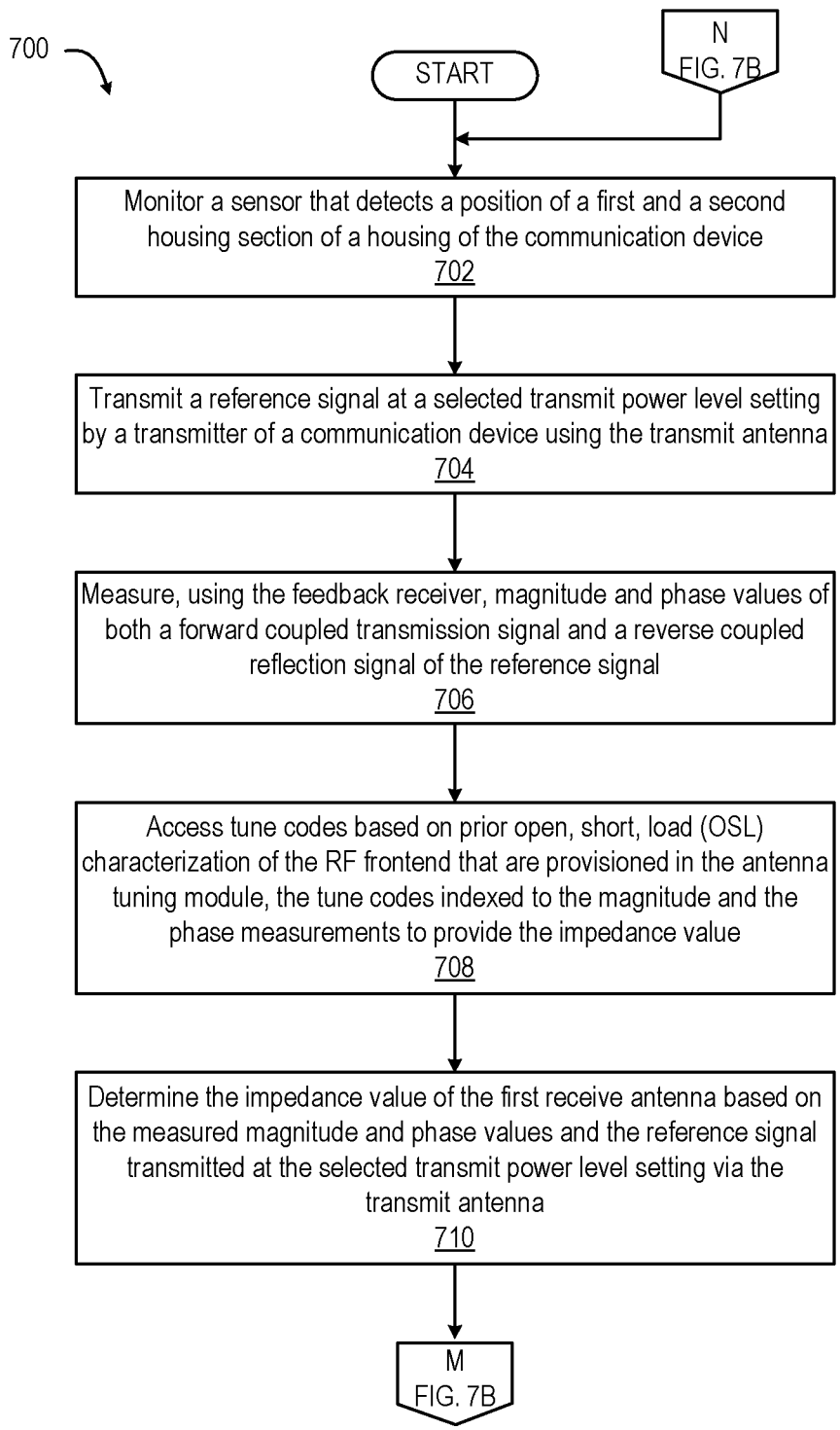
FIGS. 7A-7B (FIG. 7) present a flow diagram of a method for closed loop tuning of a receive antenna based on a proximity association with a transmit antenna in a communication device having a variable positionable housing, according to one or more embodiments.
Figure 7B:
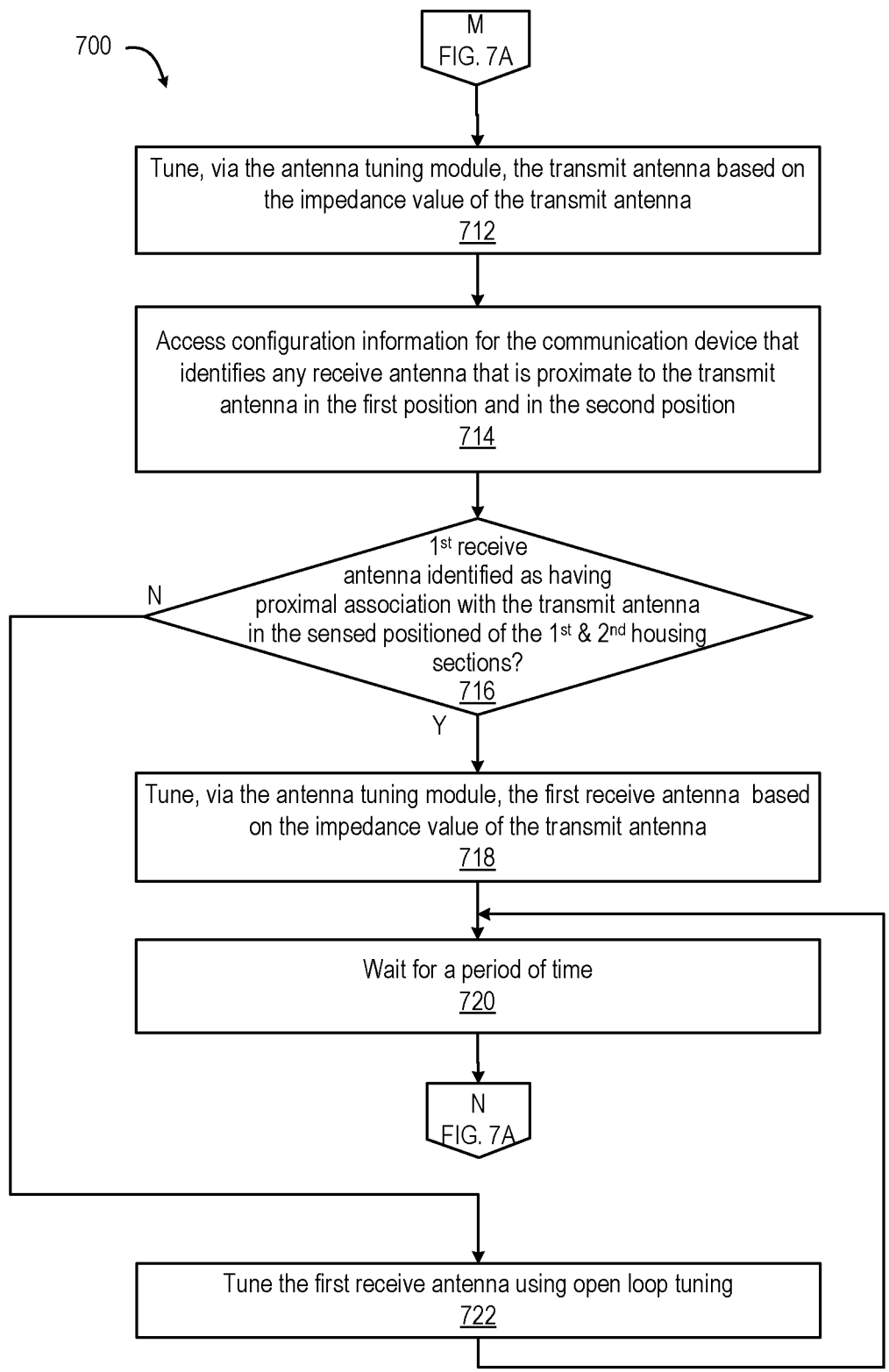

FIGS. 7A-7B (FIG. 7) present a flow diagram of a method for closed loop tuning of a receive antenna based on a proximity association with a transmit antenna in communication device 100 (FIG. 1) having a variable positionable housing. In one or more embodiments, the variable positionable housing includes a housing section that flips open or close or slides in and out. The description of method 700 is provided with general reference to the specific components illustrated within the preceding FIGS. 1-5. In at least one embodiment, method 700 can be implemented using controller 101 (FIG. 1) to enable RF frontend 102 (FIG. 1) to tune receive antennas 104*a*-104*n* (FIG. 1). With reference to FIG. 7A, method 700 includes monitoring a sensor that detects a position of a first and a second housing section of a housing of the communication device (block 702). The first housing section contains the first antenna, which is a transmit antenna used to at least transmit and possibly to transceive, and the second housing section contains the second antenna, which is a first receive antenna. The first housing section is coupled to the second housing section and is movable between a first position and a second position. The transmit antenna and the receive antenna are brought into proximity while the housing is in the first position and spaced apart while the housing is in the second position. Method 700 includes transmitting a reference signal at a selected transmit power level setting by a transmitter of a communication device using the transmit antenna (block 704). In one or more embodiments, the reference signal is an uplink communication signal transmitted to a serving node of a radio access network. In one or more embodiments, the reference signal includes transmitted reference signal (SRS) symbols. Method 700 includes measuring, using the feedback receiver, magnitude and phase values of both a forward coupled transmission signal and a reverse coupled reflection signal of the reference signal (block 706). Method 700 includes accessing tune codes that are based on prior open, short, and load (OSL) characterization of the RF frontend. The tune codes are provisioned in the antenna tuning module. The tune codes are indexed to the magnitude and the phase measurements to provide the impedance value (block 708). Method 700 includes determining the impedance value of the first receive antenna based on the measured magnitude and phase values and the reference signal transmitted at the selected transmit power level setting via the transmit antenna (block 710).

With reference to FIG. 7B, method 700 includes tuning, via the antenna tuning module, the transmit antenna based on the impedance value of the transmit antenna (block 712). Method 700 includes accessing configuration information for the communication device that associates any receive antenna that is proximate to the transmit antenna in the first position and in the second position (block 714). A determination is made, in decision block 716, whether the first receive antenna is identified as having a proximal association with the transmit antenna in the sensed position of the first and second housing sections. The position is sensed by the housing sensor. In response to determining that the first receive antenna is identified as having a proximal association with the transmit antenna, method 700 includes tuning, via the antenna tuning module, the first receive antenna based on the impedance value of the transmit antenna (block 718). Method 700 includes waiting for a period of time (block 720). Then method 700 returns to block 702 (FIG. 7A). In response to determining that the first receive antenna is not identified as having a proximal association with the transmit antenna, method 700 includes tuning the first receive antenna using open loop tuning (block 722). Then method 700 returns to block 720.

For clarity, method 700 includes a proximity association between one transmit antenna and one receive antenna. In one or more embodiments, more than one transmit antenna and more than one receive antenna can be tuned using proximity association. In addition, a communication device can have a fixed proximity association between transmit and receive antennas that is not affected by a positionable housing section. In one or more embodiments, a communication device has a housing with more than two sections. In one or more embodiments, a communication device can have two sections that are positionable in more than two positions that cause different proximity associations between transmit and receive antennas.

In each of the above flow charts presented herein, certain steps of the methods can be combined, performed simultaneously or in a different order, or perhaps omitted, without deviating from the spirit and scope of the described innovation. While the method steps are described and illustrated in a particular sequence, use of a specific sequence of steps is not meant to imply any limitations on the innovation. Changes may be made with regards to the sequence of steps without departing from the spirit or scope of the present innovation. Use of a particular sequence is therefore, not to be taken in a limiting sense, and the scope of the present innovation is defined only by the appended claims.

Aspects of the present innovation are described above with reference to flowchart illustrations and/or block diagrams of methods, apparatus (systems) and computer program products according to embodiments of the innovation. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As will be appreciated by one skilled in the art, embodiments of the present innovation may be embodied as a system, device, and/or method. Accordingly, embodiments of the present innovation may take the form of an entirely hardware embodiment or an embodiment combining software and hardware embodiments that may all generally be referred to herein as a "circuit," "module" or "system."

While the innovation has been described with reference to exemplary embodiments, it will be understood by those skilled in the art that various changes may be made, and equivalents may be substituted for elements thereof without departing from the scope of the innovation. In addition, many modifications may be made to adapt a particular system, device or component thereof to the teachings of the innovation without departing from the essential scope thereof. Therefore, it is intended that the innovation not be limited to the particular embodiments disclosed for carrying out this innovation, but that the innovation will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the innovation. As used herein, the singular forms "a", "an" and "the" are intended to include the plural forms as well, unless the context clearly indicates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present innovation has been presented for purposes of illustration and description but is not intended to be exhaustive or limited to the innovation in the form disclosed. Many modifications and variations will be apparent to those of ordinary skill in the art without departing from the scope and spirit of the innovation. The embodiments were chosen and described in order to best explain the principles of the innovation and the practical application, and to enable others of ordinary skill in the art to understand the innovation for various embodiments with various modifications as are suited to the particular use contemplated.

What is claimed is:

1. A communication device comprising:
    an antenna subsystem comprising more than one antenna, the more than one antenna comprising a first antenna positioned proximate to a second antenna;
    a radio frequency (RF) frontend comprising:
        a transmitter;
        a receiver;
        an antenna tuning module coupled to the more than one antenna;
    a memory containing a proximal antenna association tuning (PAAT) application; and
    a controller communicatively coupled to the RF frontend and the memory and that executes the PAAT application to enable the communication device to:
        transmit a reference signal by the transmitter using the first antenna of the more than one antenna;
        measure an impedance value of the first antenna based on the transmission of the reference signal;
        identify a second antenna of the more than one antenna that is proximate to the first antenna; and
        tune, via the antenna tuning module, the first and the second antenna based on the impedance value of the first antenna.

2. The communication device of claim 1, further comprising:
    a housing having a first housing section containing the first antenna and a second housing section containing the second antenna, the first housing section coupled to the second housing section and movable between a first position and a second position, the first antenna and the second antenna brought into proximity while the housing is in the first position and spaced apart while the housing is in the second position; and
    a sensor that detects the position of the housing, wherein the controller is communicatively coupled to the sensor and executes the PAAT application to enable the communication device to identify that the second antenna is proximate to the first antenna while the housing is in the first position.

3. The communication device of claim 1, further comprising a feedback receiver, wherein the controller executes the PAAT application to enable the communication device to:
    transmit the reference signal using the first antenna at a selected transmit power level setting of the transmitter;
    measure, using the feedback receiver, magnitude and phase values of both a forward coupled transmission signal and a reverse coupled reflection signal of the reference signal; and
    determine the impedance value of the first receive antenna based on the measured magnitude and phase values and the reference signal transmitted at the selected transmit power level setting.

4. The communication device of claim 1, wherein the controller executes the PAAT application to enable the communication device to transmit the reference signal comprising an uplink communication signal to a serving node of a radio access network.

5. The communication device of claim 1, wherein the controller executes the PAAT application to enable the communication device to transmit the reference signal using sounding reference signal (SRS) symbols.

6. The communication device of claim 1, wherein the controller executes the PAAT application to enable the communication device to determine the impedance value by accessing tune codes based on prior open, short, and load (OSL) characterization of the RF frontend that are provisioned in the antenna tuning module, the tune codes indexed to magnitude and the phase measurements to provide the impedance value.

7. A method comprising:
    transmitting a reference signal by a transmitter of a communication device using a first antenna of more than one antenna;
    measuring an impedance value of the first antenna based on the transmission of the reference signal;
    identifying, by a controller, a second antenna of the more than one antenna that is proximate to the first antenna; and
    tuning, via an antenna tuning module, the first and the second antenna based on the impedance value of the first antenna.

8. The method of claim 7, wherein identifying the second antenna of the more than one antenna that is proximate to the first antenna comprises monitoring a sensor that detects a position of a first and a second housing section of a housing of the communication device, the first housing section containing the first antenna and the second housing section containing the second antenna, the first housing section coupled to the second housing section and movable between a first position and a second position, the first antenna and the second antenna brought into proximity while the housing is in the first position and spaced apart while the housing is in the second position.

9. The method of claim 7, further comprising:
    transmitting the reference signal using the first antenna at a selected transmit power level setting of the transmitter;
    measuring, using a feedback receiver, magnitude and phase values of both a forward coupled transmission signal and a reverse coupled reflection signal of the reference signal; and
    determining the impedance value of the first receive antenna based on the measured magnitude and phase values and the reference signal transmitted at the selected transmit power level setting.

10. The method of claim 7, wherein transmitting the reference signal comprises transmitting an uplink communication signal to a serving node of a radio access network.

11. The method of claim 7, further comprising transmitting the reference signal using sounding reference signal (SRS) symbols.

12. The method of claim 7, wherein determining the impedance value comprises accessing tune codes based on prior open, short, and load (OSL) characterization of an RF frontend that are provisioned in the antenna tuning module, the tune codes indexed to magnitude and the phase measurements to provide the impedance value.

13. A computer program product comprising:
    a non-transitory computer readable storage device; and
    program code on the computer readable storage device that when executed by a processor associated with a communication device having one or more receive antennas, an antenna tuning module, and a radio frequency (RF) frontend, the program code enables the communication device to provide the functionality of:
- transmitting a reference signal by a transmitter of a communication device using a first antenna of more than one antenna;
- measuring an impedance value of the first antenna based on the transmission of the reference signal;
- identifying, by a controller, a second antenna of the more than one antenna that is proximate to the first antenna; and
- tuning, via the antenna tuning module, the first and the second antenna based on the impedance value of the first antenna.

14. The computer program product of claim 13, wherein the program code enables the communication device to provide the functionality of identifying the second antenna of the more than one antenna that is proximate to the first antenna comprises monitoring a sensor that detects a position of a first and a second housing section of a housing of the communication device, the first housing section containing the first antenna and the second housing section containing the second antenna, the first housing section coupled to the second housing section and movable between a first position and a second position, the first antenna and the second antenna brought into proximity while the housing is in the first position and spaced apart while the housing is in the second position.

15. The computer program product of claim 13, wherein the program code enables the communication device to provide the functionality of:
- transmitting the reference signal using the first antenna at a selected transmit power level setting of the transmitter;
- measuring, using a feedback receiver, magnitude and phase values of both a forward coupled transmission signal and a reverse coupled reflection signal of the reference signal; and
- determining the impedance value of the first receive antenna based on the measured magnitude and phase values and the reference signal transmitted at the selected transmit power level setting.

16. The computer program product of claim 13, wherein the program code enables the communication device to provide the functionality of transmitting the reference signal comprises transmitting an uplink communication signal to a serving node of a radio access network.

17. The computer program product of claim 13, wherein the program code enables the communication device to provide the functionality of transmitting the reference signal using sounding reference signal (SRS) symbols.

18. The computer program product of claim 13, wherein the program code enables the communication device to provide the functionality of determining the impedance value comprising accessing tune codes based on prior open, short, and load (OSL) characterization of the RF frontend that are provisioned in the antenna tuning module, the tune codes indexed to magnitude and the phase measurements to provide the impedance value.

* * * * *